United States Patent [19]
Wong

[11] Patent Number: 6,134,141
[45] Date of Patent: Oct. 17, 2000

[54] DYNAMIC WRITE PROCESS FOR HIGH BANDWIDTH MULTI-BIT-PER-CELL AND ANALOG/MULTI-LEVEL NON-VOLATILE MEMORIES

[75] Inventor: Sau-Ching Wong, Hillsborough, Calif.

[73] Assignee: SanDisk Corporation, Sunnyvale, Calif.

[21] Appl. No.: 09/224,656

[22] Filed: Dec. 31, 1998

[51] Int. Cl.[7] .................................................. G11C 11/34
[52] U.S. Cl. ............................ 365/185.03; 365/185.22; 365/185.25
[58] Field of Search ......................... 365/185.03, 185.21, 365/185.23, 185.22, 185.25, 185.01

[56] References Cited

U.S. PATENT DOCUMENTS

| 5,587,951 | 12/1996 | Jazayeri et al. | 365/203 |
| 5,784,315 | 7/1998 | Itoh | 365/185.22 |

*Primary Examiner*—David Nelms
*Assistant Examiner*—Hoai V. Ho
*Attorney, Agent, or Firm*—Majestic, Parsons, Siebert & Hsue

[57] ABSTRACT

A write process and circuit for a non-volatile memory such as a multi-bit-per-cell Flash memory has multiple local memory arrays and a global bias circuit that charges row lines in the arrays for programming operations. A programming operation in an array includes a charging period during which the global bias circuit charges a selected row line to a voltage corresponding to a value to be written in a memory cell and a sequence of program cycles and verify cycles during which the selected row line is isolated to preserve the charge from the bias circuit. A global control circuit can use a capacitive coupling to the charged row line to raise and lower the row line voltage. In one embodiment, the row line voltage rises to a programming voltage to change the threshold voltage of the selected cell during program cycles and falls to a verify voltage during verify cycles to sense whether the selected cell has a target threshold voltage. Alternatively, the row line voltage remains constant as charged by the bias circuit if a maximum current for biasing a column line connected to a sense amplifier causes the programming voltage to be equal to the trip point of the sense amplifier when the memory cell has the target threshold voltage.

17 Claims, 9 Drawing Sheets

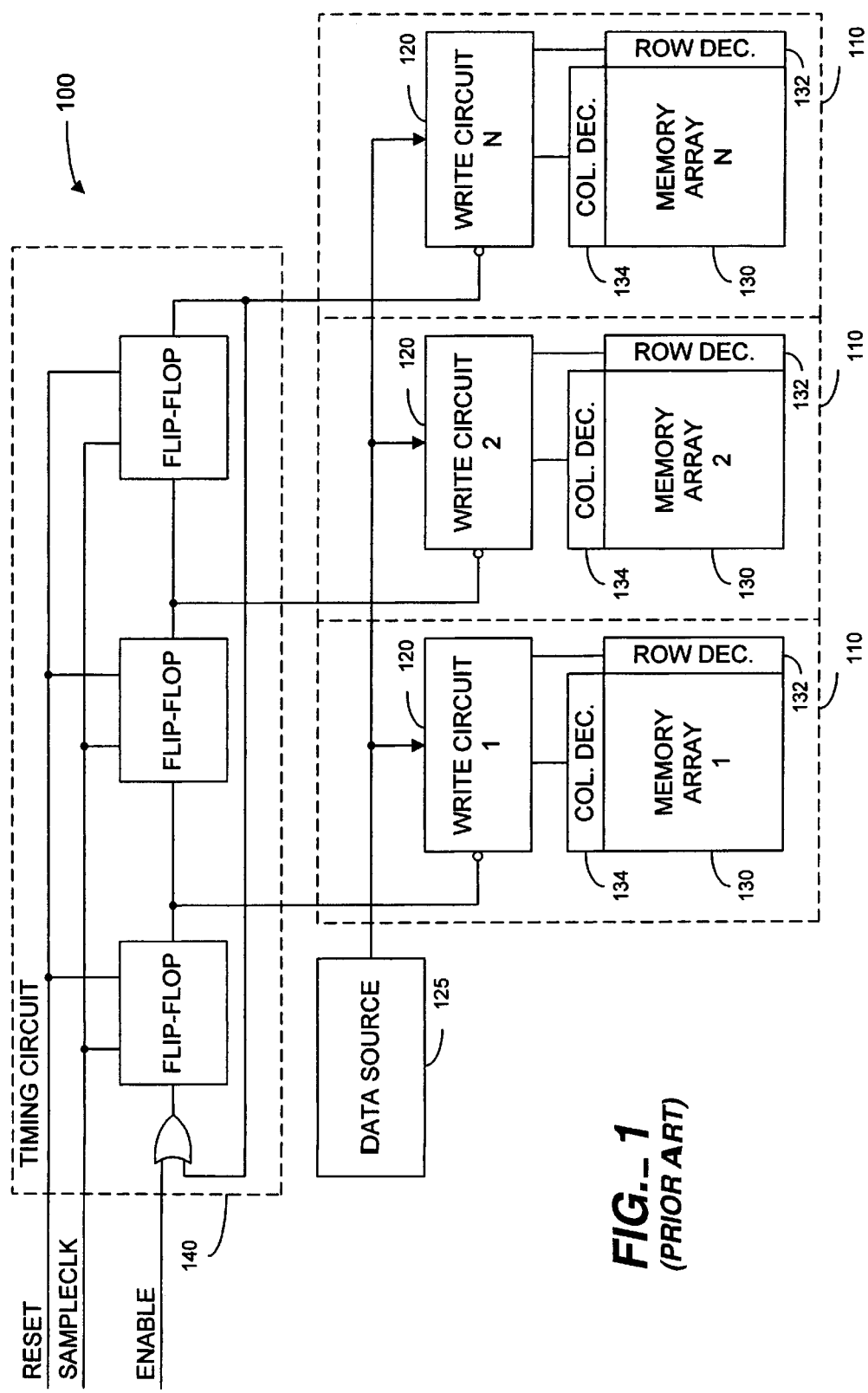
FIG._1
(PRIOR ART)

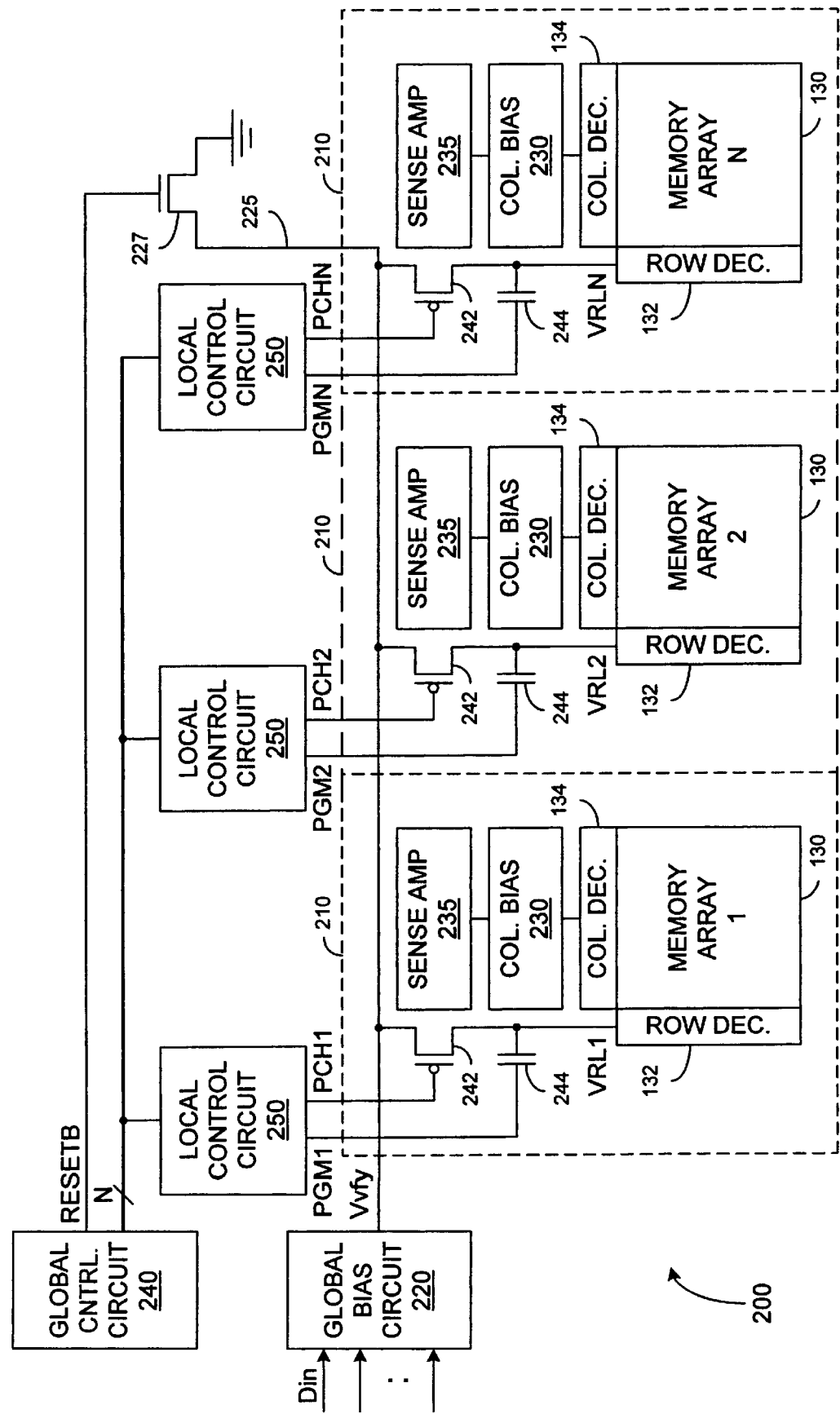
FIG._2

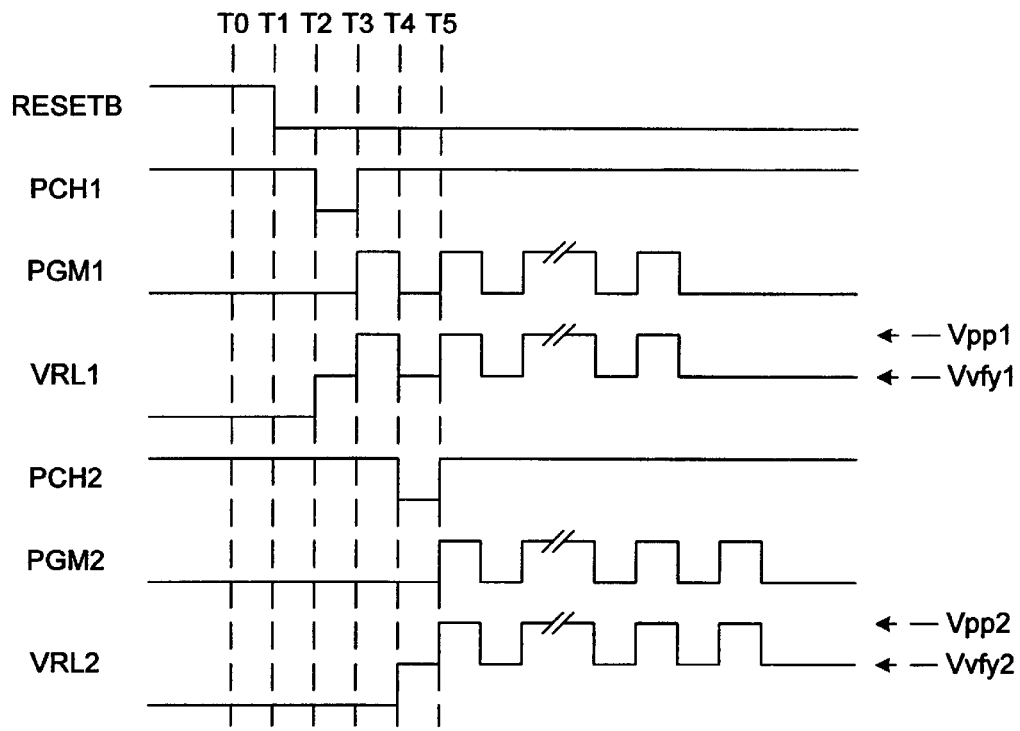
FIG._3A
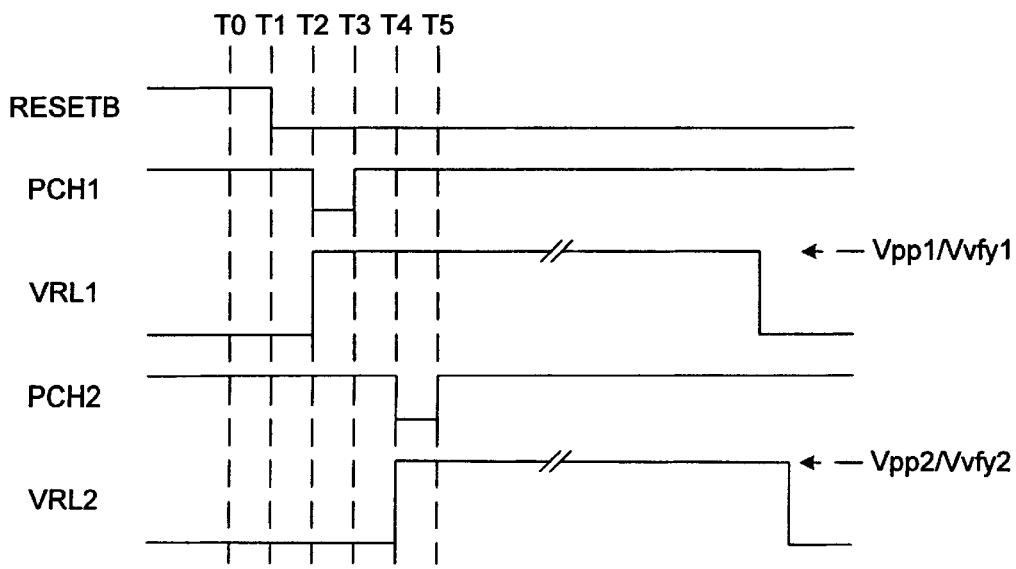
FIG._6

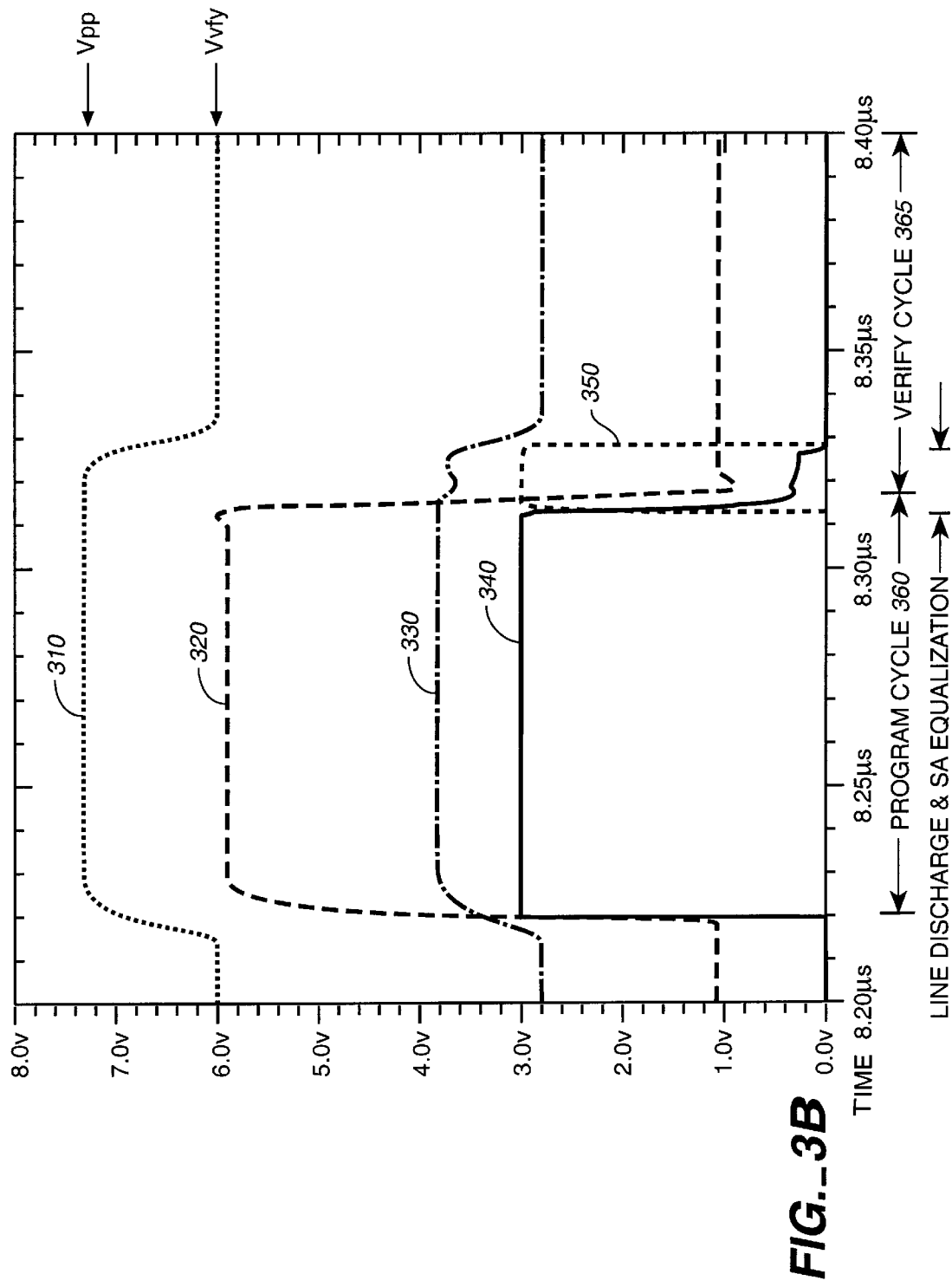

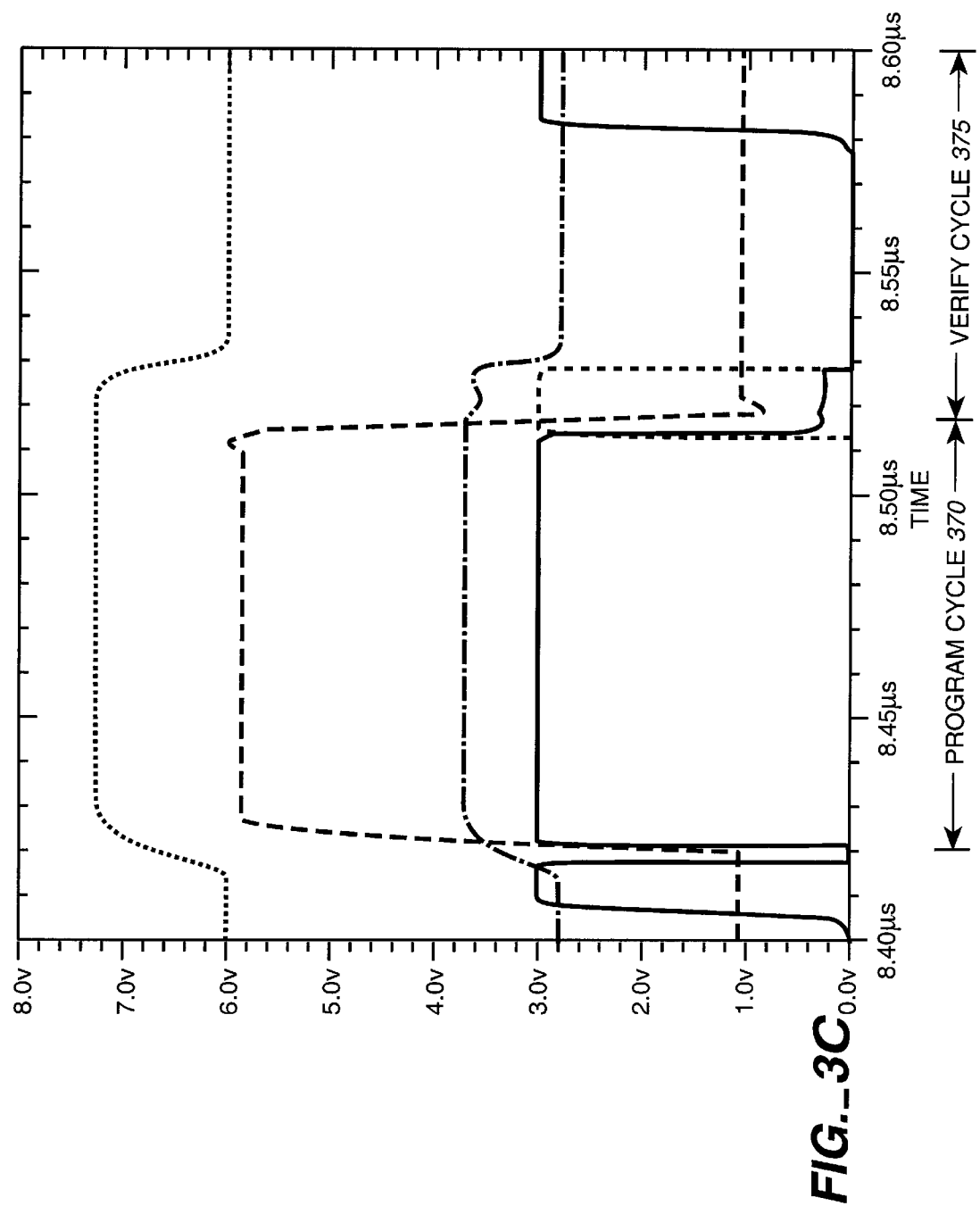

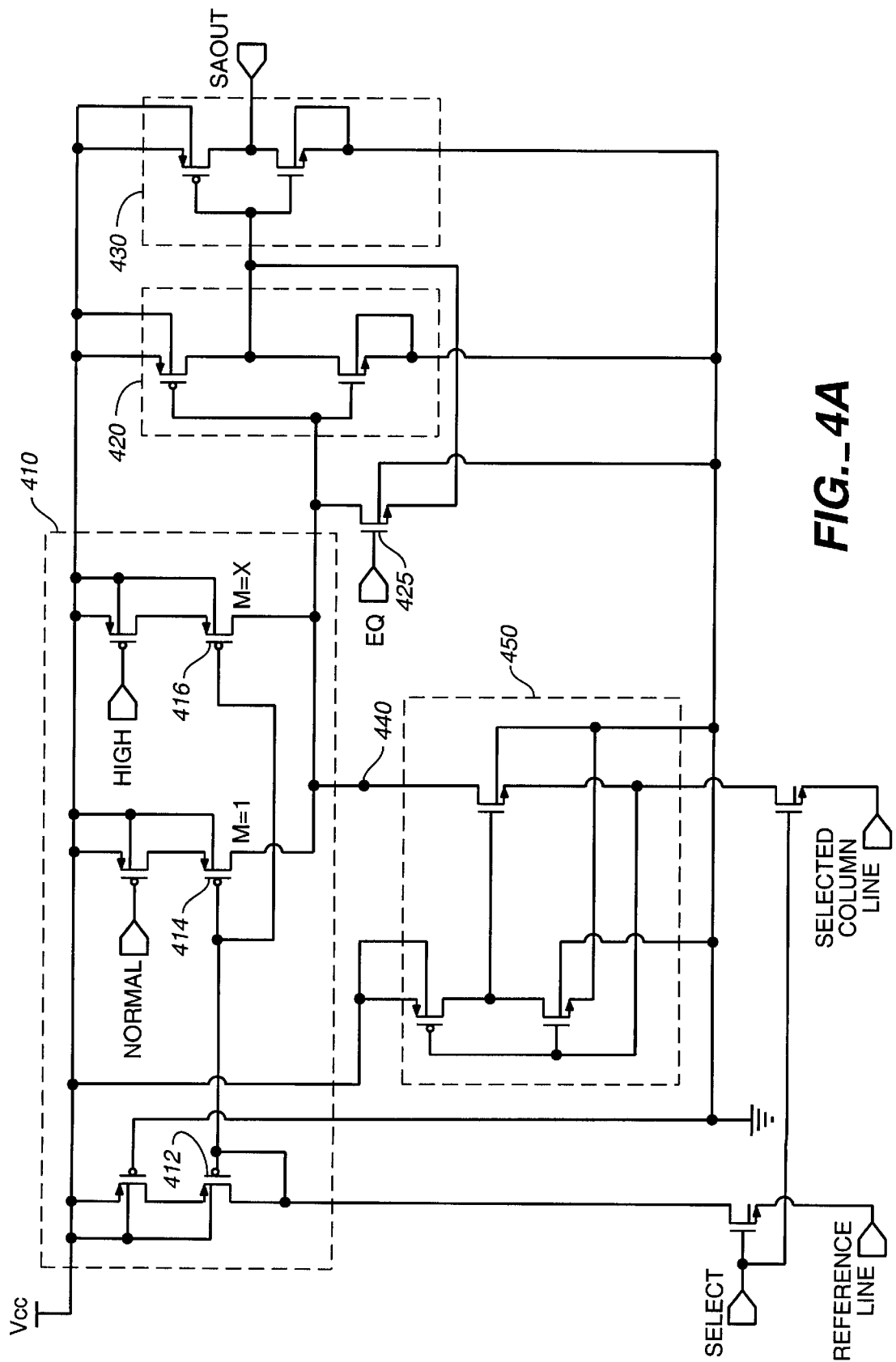
FIG._4A

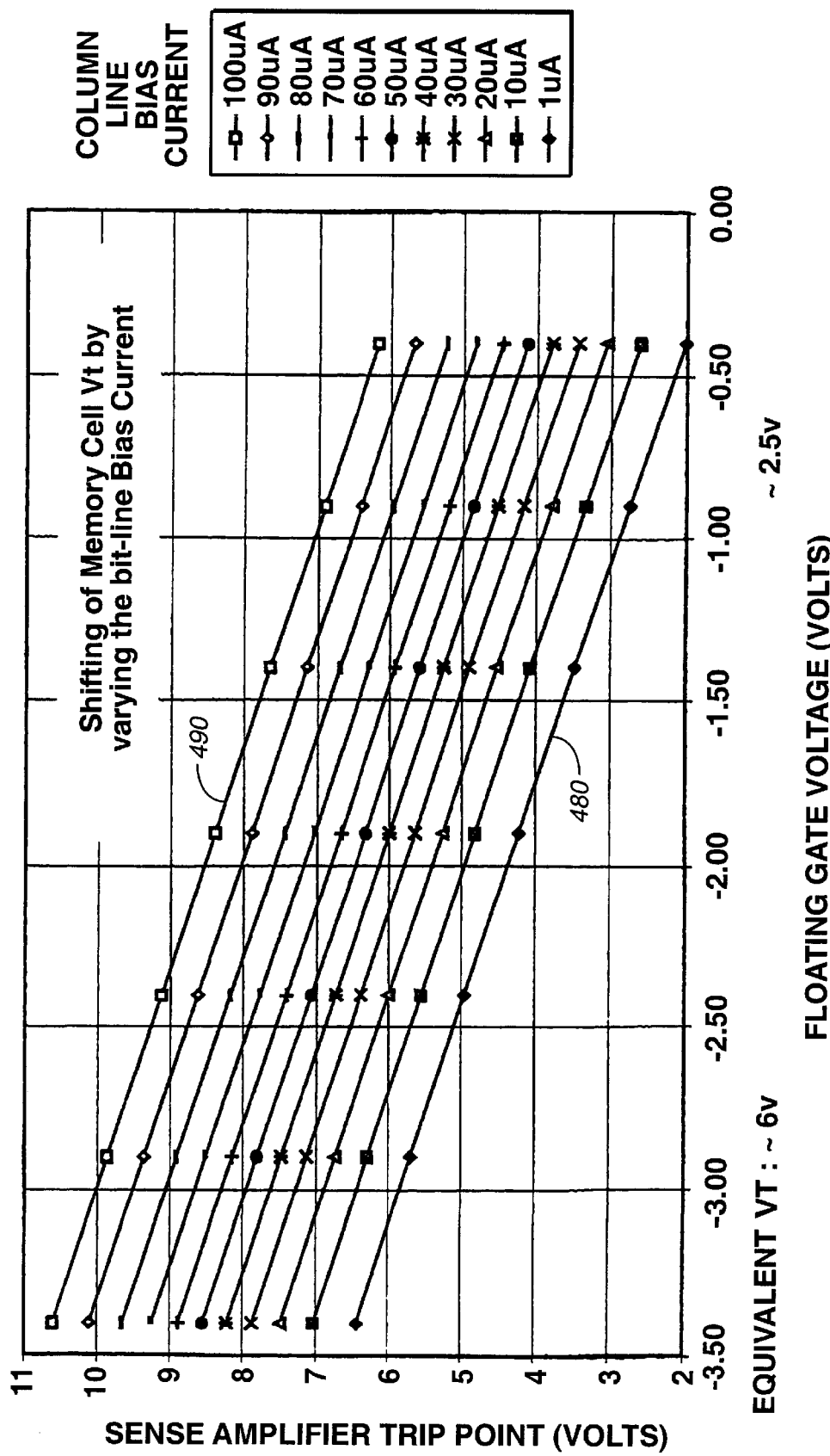
FIG._4B

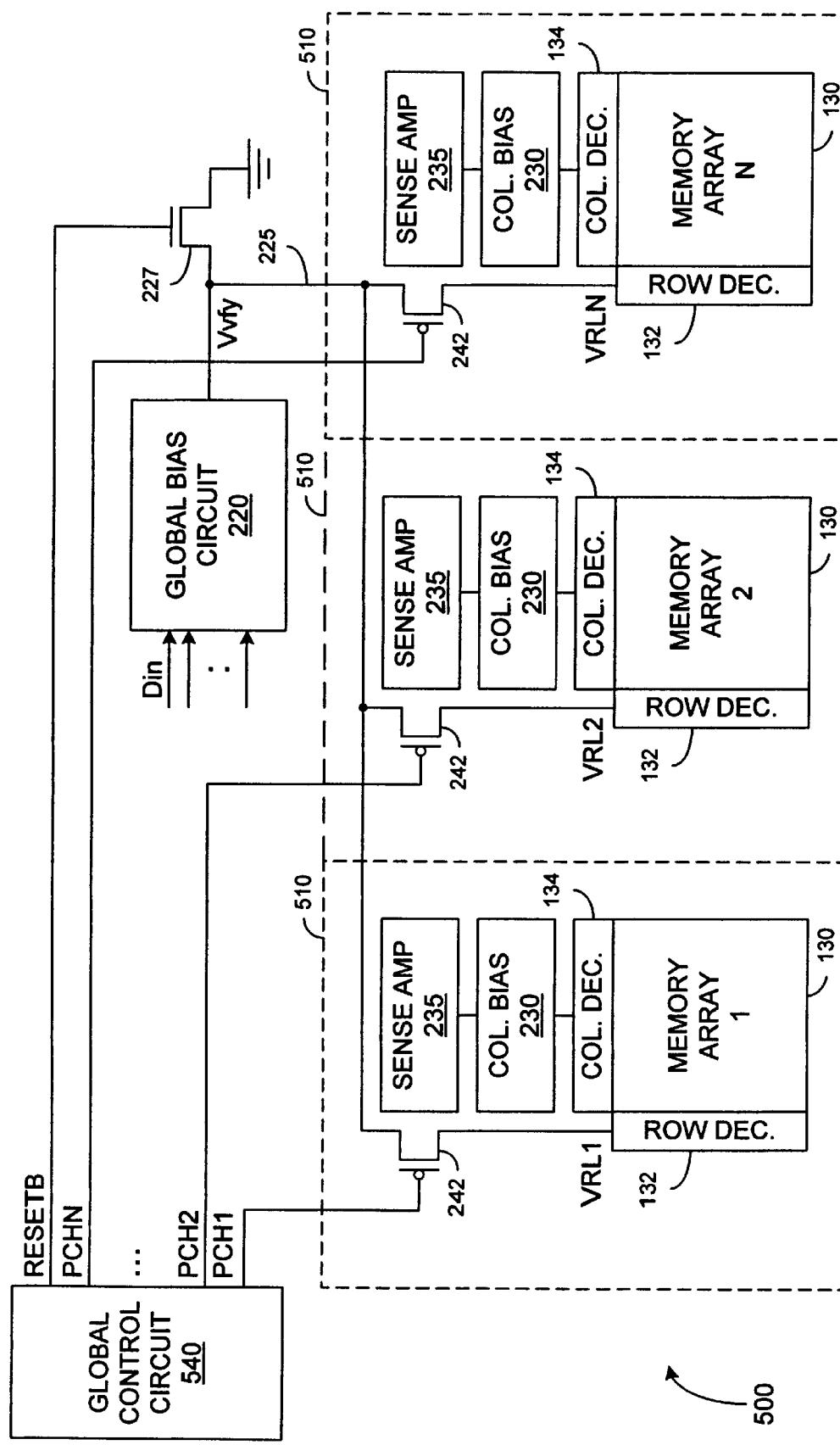
FIG._5

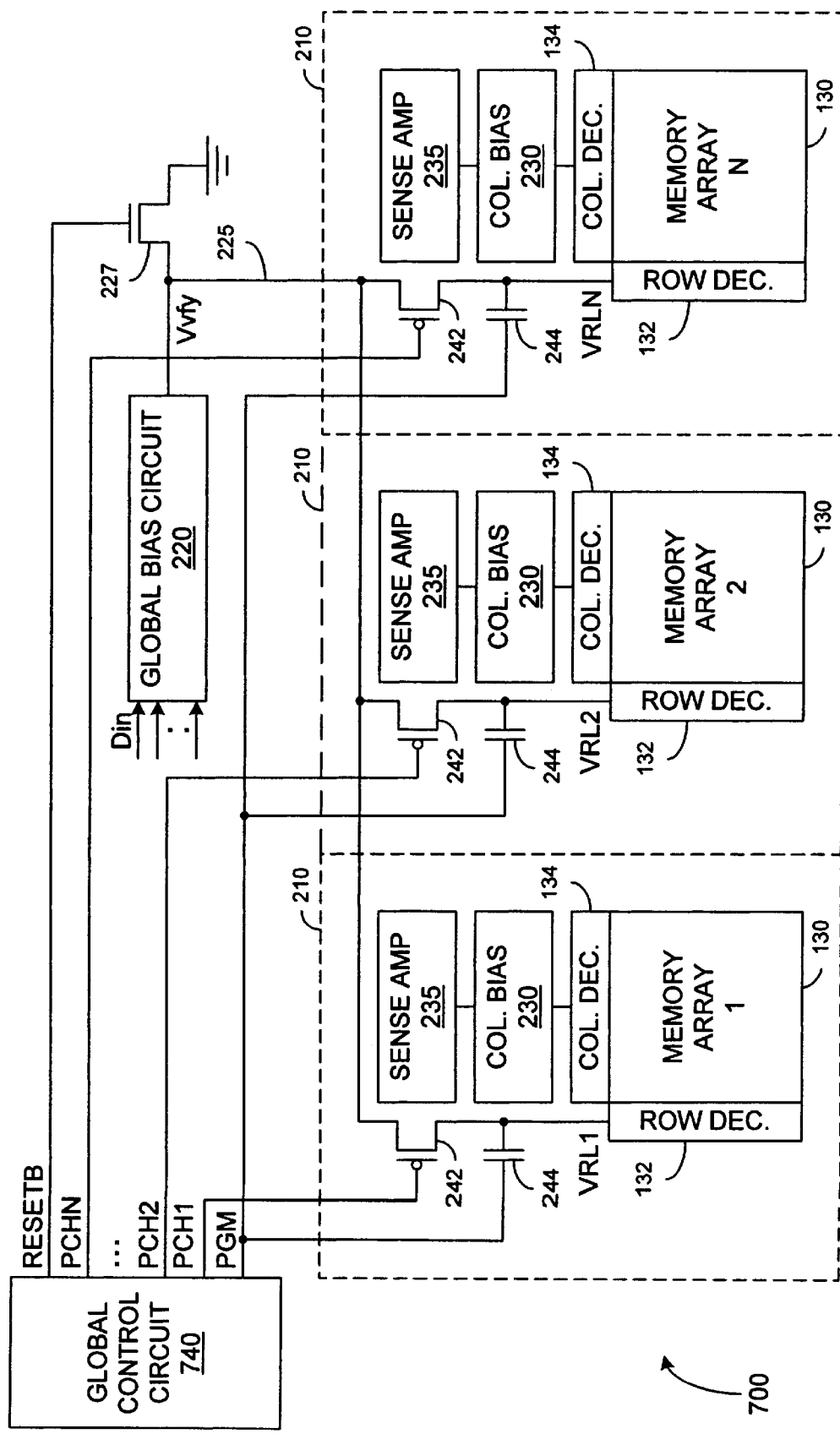
FIG._7

6,134,141

DYNAMIC WRITE PROCESS FOR HIGH BANDWIDTH MULTI-BIT-PER-CELL AND ANALOG/MULTI-LEVEL NON-VOLATILE MEMORIES

BACKGROUND

1. Field of the Invention

This invention relates to non-volatile semiconductor memory and to circuits and processes for writing threshold voltages in memories, particularly multi-bit-per-cell memories.

2. Description of Related Art

Most known multi-bit-per-cell non-volatile memory integrated circuits have memory cells that include floating gate devices such as floating gate or split gate transistors. Each floating gate device has a programmable threshold voltage in a range that is divided into multiple intervals with each interval corresponding to a different multibit value. To write a particular multibit value in a memory cell, the threshold voltage of the floating gate device in the memory cell is precisely programmed into the threshold voltage interval that corresponds to the value. Accordingly, write methods for precisely programming threshold voltages have been developed, but such write methods can be slow. Accordingly, the write speed can limit the data bandwidth for a multi-bit-per-cell memory. Similar bandwidth limitations arise in analog/multi-level non-volatile memory where a write operation must set the threshold voltage of a memory cell precisely to a level that corresponds to an analog/multi-level value being written.

One way to increase the data bandwidth for programming is to include in an integrated circuit memory, multiple memory arrays or banks that operate in parallel or pipeline fashion. For example, U.S. Pat. No. 5,680,341, entitled "Pipelined Record and Playback for Analog Non-Volatile Memory", which is hereby incorporated by reference in its entirety, describes known analog memory systems using pipelined write operations for high data bandwidth. FIG. 1 is a block diagram of a non-volatile memory 100 including multiple write pipelines 110 for pipelined write operations. Each write pipeline 110 includes an array 130 of memory cells and a write circuit 120 that couples to a row decoder 132 and a column decoder 134 for the associated array 130. Pipelines 110 operate independently to complete separate programming operations that a timing circuit 140 sequentially starts. As a result, N pipelines 110 simultaneously perform different stages of up to N write operations for writing up to N different data values from a data source 110. The number N of pipelines 110 in memory 100 determines the maximum number of simultaneous write operations memory 100 and accordingly controls the maximum data bandwidth for writing to memory 100.

The improved data bandwidth of memory 100 comes at the cost of increased circuit complexity. In particular, each write pipeline 110 includes a separate write circuit 120. Write circuits for multi-bit-per-cell and/or analog memories and can be complex, and the redundant use of the write circuits increases required integrated circuit area and the costs of high bandwidth multi-bit-per-cell and analog/multi-level memories.

SUMMARY

In accordance with the invention, a global bias circuit in a non-volatile integrated memory circuit sequentially charges selected row lines in separate memory arrays. Each memory array preserves the charge on the selected row line during a write operation in that memory array, and the charge controls programming and/or verify voltages on the control gate of a memory cell selected for programming. Accordingly, each array does not require a latch or a sample-and-hold circuit to temporarily store a data value since the charge on the selected row line indicates the data value being written. Further, each array does not require a voltage source, resistor tree, or voltage level-shifter to provide the programming or verify voltages that depend on the value being written.

For one write operation in accordance with an embodiment of the invention, the global bias circuit charges a selected row line in a memory array to a verify voltage that is associated with a target threshold voltage to be written to a selected memory cell on the selected row line. The verify voltage Vvfy is the control gate voltage at which a sense amplifier senses a transition in the conductivity of the memory cell if the memory cell has the target threshold voltage. The write operation includes a series of program cycles and verify cycles. During the program cycles, the combination of the control gate voltage, a drain voltage, and a source voltage changes the threshold voltage of the selected memory cell. During the verify cycles, the sense amplifier senses the conductivity of the selected memory cell while the charged row line maintains the control gate of the memory cell at the verify voltage. The write operation stops when the sense amplifier senses that the memory cell is in the appropriate conductivity state during a verify cycle.

During the program cycles, a global or local control circuit and voltage source can change the voltage on the selected row line using a capacitive coupling. In particular, the control circuit, through the capacitive coupling with the selected row line, raises the row line voltage from the verify voltage to a programming voltage that depends on the initial charge on the selected row line and the capacitive coupling ratio. Since the global bias circuit selected the row line charge (or the verify voltage) according to the target threshold voltage being programmed, the programming voltage also varies according to the target threshold voltage level. A high target threshold voltage has a high verify voltage and a high programming voltage during program cycles. A low target threshold voltage has a low verify voltage and a low programming voltage during program cycles. This improves programming precision because the low programming voltage decreases the change in threshold voltage per program cycle for low target threshold voltages.

As an alternative to using a capacitive coupling to change the row line voltage during programming cycles, a column bias circuit that biases a selected column line for sensing during verify cycles provides a maximum column line bias current selected so that the programming voltage is the same as the verify voltage. Accordingly, the global bias circuit charges the selected row line to a level corresponding to both the verify voltage and the programming voltage, and the row line voltage of the selected memory cell remains constant during both program cycles and verify cycles.

One progamming process in accordance with an embodiment of the invention connects a bias circuit to charge a line that is coupled to a control gate of a memory cell to be programmed. The bias circuit is then disconnected from the line with charge from the bias circuit remaining trapped on the line. The charge on the line controls a first programming voltage that is on the control gate of the memory cell when a second programming voltage is applied to a drain of the memory cell. The combination of the first programming voltage on the control gate, the second programming voltage on the drain, and a voltage on a source of the memory cell changes a threshold voltage in the memory cell, typically by channel hot electron injection. To reach the first programming voltage the process optionally include capacitively coupling a voltage to the line to raise the line to the first programming voltage from a voltage of the bias circuit. Alternatively, the bias circuit charges the line with a voltage about equal to the first programming voltage. In either case, the programming process may include a sequence of program and verify cycles wherein the threshold voltage of the selected memory cell changes during program cycles and the verify cycles sense the threshold voltage of the selected memory cell. When a capacitive coupling is used to change the row line voltage, a maximum bias current for a column line coupled to a sense amplifier that performs the sensing is such that the capacitively coupled voltage that is required to raise the line to the first programming voltage is a supply voltage of an integrated circuit containing the memory cell. Accordingly, no charge pump is required in the control circuit that raises and lowers row line voltages.

This programming process is particularly suited to memory including multiple memory arrays because a single "global" bias circuit can be connected to for charging lines in any of the arrays. Thus, pipelined programming processes in multiple arrays can be performed using a shared global bias circuit rather than local circuitry for each array. For a multi-bit-per-cell memory, the bias circuit is a structure such as a resistor tree with multiplexing circuitry so that an input multibit data signal selects a bias voltage corresponding to the value of data signal. Thus, each charged line is charged to a voltage that is selected for the value to be written into a memory cell connected to the line.

One embodiment of the invention is a non-volatile memory such as a multi-bit-per-cell Flash memory. The memory includes a plurality of memory arrays, a bias circuit, and a control circuit. Each memory array includes memory cells arranged in rows and columns, row lines with each row line being coupled control gates of memory cells that are in a row of memory cells associated with the row line, and a row decoder coupled to the row lines. The bias circuit generates a bias signal having a voltage that depends on the value of an input data signal. The control circuit selects which of the plurality of arrays receives the bias signal from the bias circuit. During a first charging period of a write operation, the control circuit connects the bias circuit to the row decoder in a first array, and the bias circuit charges a selected row line in the first array for programming a first value in a first memory cell. During a second charging period of the write operation, the control circuit connects the bias circuit to the row decoder in a second array, and the bias circuit charges a selected row line in the second array for programming a second value in second memory cell. For a pipelined write operation, the second charging period occurs during programming of the first memory cell.

BRIEF DESCRIPTION OF THE DRAWINGS

FIG. 1 is a block diagram of a known multibank memory providing a high data bandwidth.

FIG. 2 is a block diagram of an embodiment of the invention where a multibank memory has a global bias circuit for charging selected row lines and a capacitive coupling for varying row line voltages during programming.

FIGS. 3A, 3B, and 3C are timing diagrams for signals generated during write operations in the memory of FIG. 2.

FIG. 4A is a schematic diagram of a sense amplifier with associated biasing circuits.

FIG. 4B shows how a column line bias current for a typical sense amplifier affects the control gate voltage that corresponds to the trip point of the sense amplifier.

FIG. 5 is a block diagram of an embodiment of the invention where a multibank memory has a global bias circuit for charging selected row lines to voltages that remain constant during write operations.

FIG. 6 is a timing diagram for a write operation in the memory of FIG. 5.

FIG. 7 is a block diagram of an embodiment of the invention having less local write control circuitry.

Use of the same reference symbols in different figures indicates similar or identical items.

DETAILED DESCRIPTION OF THE PREFERRED EMBODIMENTS

In accordance with an aspect of the invention, a dynamic write process for multi-bit-per-cell memories uses a global bias circuit to charge a selected row line for a write operation. Charge leakage from the selected row line is controlled so that the charge on the selected row line remains nearly constant during programming, but a capacitive coupling can change the voltage on the selected row line if necessary during the write operation. To avoid the need to vary the voltage on the selected row line, a bias current supplied to a column line during a sensing operation is at a level such that the row line voltage used when changing the threshold voltage of the selected memory cell is equal to a sense amplifier's trip point when the selected memory cell has the target threshold voltage.

FIG. 2 is a block diagram of a non-volatile memory 200 in accordance with an embodiment of the invention. Memory 200 includes multiple arrays 130 of Flash memory cells in respective write pipelines 210. A global control circuit 240 controls starting of write operations in write pipelines 210 of memory 200 and optionally includes a timing circuit that sequentially starts write pipelines 210 for a pipelined writing or recording of data. Such timing circuits and pipelined writing or recording operations are further described in U.S. patent application Ser. No. 09/103,623, filed Jun. 23, 1998 and U.S. patent application Ser. No. 09/128,225, filed Aug. 3, 1998 which are hereby incorporated by reference in their entirety. The pipelined writing can be used to store a data sequence that is to large to store in a signal memory cell. For example, a 32-bit value can be written to eight memory cells when each memory cell stores four bits of information, and global control circuit 240 can sequentially start eight 4-bit write operations in eight different pipelines 210.

Each memory array 130 in pipelines 210 can be a conventional non-volatile memory array that includes rows and columns of memory cells. Such memory arrays are known for storing a binary, analog, or multibit digital value in each memory cell. In arrays 130, each memory cell is, for example, a single floating gate transistor, a split gate transistor, or a multiple-transistor memory cell. In an exemplary embodiment of the invention, which is described below, memory 200 is a flash EEPROM, and each memory cell consists of a single N-channel floating gate transistor. Other memory architectures are also suitable. Control gates of the memory cells in a row of an array 130 couple to a row line associated with the row. Drains of the memory cells in a column of an array 130 couple to a column line associated with the column, and sources of the memory cells in a sector of an array 130 couple to a source line associated with the sector.

In the exemplary embodiment, each sector contains multiple columns of memory cells in an array 130, but alternative memory architectures use different kinds of sectors, for example, a sector including an entire array 130 or sectors containing one or multiple rows of memory cells. As is well known, an erase operation for Flash memory simultaneously erases all memory cells in a sector of an array. In the exemplary embodiment, where each memory cell is an N-channel floating gate transistor, an erase operation lowers the threshold voltages of all memory cells in a sector to leave memory cells in an erased state, typically having a threshold voltage less than about 2 volts.

Memory arrays 130 are separate in that a write operation in one array 130 does not directly affect write operations in other arrays 130. Each memory array 130 has local row and column lines, a local row decoder 132 coupled to the local row lines, and a local column decoder 134 coupled to the local column lines. Each row decoder 132 receives a row address signal and selects the row line coupled to a memory cell selected for a read or write operation. Each column decoder 134 similarly receives a column address signal and selects the column line coupled to the selected memory cell. In addition to the local decoders 132 and 134, global control circuit 240 includes a global decoder that decodes a global address to select which of arrays 130 performs an erase operation, a write operation, or a read operation. In one embodiment, the global decoder is such that consecutive memory addresses correspond to memory cells in different arrays. Such decoding permits separate write pipelines 210 to operate simultaneously in a pipelined fashion and provides a high bandwidth when writing a data sequence to consecutive addresses. Further, one global address may correspond to memory cells in multiple arrays 130, for example, when memory 200 has a data width (e.g., 32 bits) that greater than the width (e.g., 4 bits) of a value that can be stored in a single memory cell.

For write operations, the column decoder 134 in each array 130 connects a column line bias circuit 230 and a sense amplifier 235 to a selected column line in the array 130. Column bias circuit 230 typically includes a first pull-up device (i.e., transistor or circuit) coupled to a programming voltage Vcp and a second pull-up device coupled to a read voltage Vcr. The first pull-up device and biases the selected column line during program cycles described below, and the second pull-up device biases the selected column line during verify cycles described below. Sense amplifier 235 can be a conventional sense amplifier that senses current through a memory cell by sensing the effect the current has on a column line voltage.

In accordance with an aspect of the invention, memory 200 includes a global bias circuit 220 and a global line 225 that connects global bias circuit 220 to each write pipeline 210. Global bias circuit 220 may be, for example, a resistor tree that generates a signal Vvfy having a voltage level selected according to the value of a multibit data signal Din. The discrete voltage levels for signal Vvfy are in one-to-one correspondence with the discrete values that a memory cell can store. For example, if each memory cell in arrays 130 can store four bits of information, a 4-bit data signal Din identifies which of sixteen voltage levels global bias circuit 220 selects for signal Vvfy. Alternatively, for an analog or multi-level memory, global bias circuit 220 can be a voltage level-shifter that receives an analog or multi-level data signal and generates signal Vvfy at a level associated with the analog or multi-level value to be written in a memory cell. The case of a multi-bit-per-cell memory is described below.

At the start of a write operation, global bias circuit 220 sets signal Vvfy on global line 225 to the voltage level corresponding to a multibit value to be written in a selected write pipeline 210, and global control circuit 240 selects and activates a local control circuit 250 for a selected write pipeline 210. The activated local control circuit 250 then turns on a pull up transistor 242 that connects global line 225 to the row decoder 132 in the selected write pipeline 210, and the row decoder 132 in the selected write pipeline 210 connects a selected local row line to global line 225 via transistor 242. As a result, global bias circuit 220 charges the selected local row line and connected circuitry including a capacitor 244 to the selected voltage of signal Vvfy. Pull up transistor 242 then shuts off to disconnect the selected row line from the global line 225, and the selected row line remains charged for the write operation in the selected write pipeline 210. During that write operation, global bias circuit 220 can charge selected row lines in other arrays 130 for writing other data values.

Charge leakage from the selected row line needs to be low to hold the charge throughout a programming operation. Potential sources of leakage from a charged row line include junction leakage for transistor 242 and transistors in row decoder 132, sub-threshold conduction of transistor 242, and signal glitches that momentarily turn-on transistors that should be off. Conventional integrated circuit design techniques including circuit simulations and modeling can determine sources of leakage that must be eliminated or minimized in a particular memory architecture to limit leakage current to suitable levels.

FIG. 3A illustrates signals in memory 200 for write operations in a first and a second of the write pipelines 210. At an initial time T0, a control signal RESETB is high so that a pull down transistor 227 is on and grounds global line 225 in preparation for beginning write operations. At a time T1, global control circuit 240 deasserts control signal RESETB so that transistor 227 disconnects global line 225 from ground and allows global bias circuit 220 to charge global line 225.

At time T2, data signal Din represents a first multibit data value to be written to a selected memory cell in the first write pipeline 210. Global bias circuit 220 generates signal Vvfy at a voltage level Vvfy1 corresponding to the first data value. Global control circuit 240 asserts a signal to activate the local control circuit 250 for the first write pipeline 210, and the local control circuit 250 asserts signal PCH1 low to turn on transistor 242 in the first write pipeline 210. During the period between times T2 and T3, global bias circuit 220 charges the local row line and the capacitor 244 in the first of arrays 210 so that the signal VRL1 on the selected row line reaches voltage Vvfy1. Signal PGM1, which is on the opposite terminal of capacitor 244, grounds the opposite terminal of capacitor 244 while the selected row line charges. At time T2, local control circuit 250 deasserts signal PCH1 to turn off transistor 242 in the first of write pipelines 210. In the first of write pipelines 210, transistor 242 remains off during the remainder of the write operation. The charging period between times T1 and T2 must be sufficient to allow global bias circuit 220 to charge the selected row line to voltage Vpp1. Accordingly, the charging period depends on the current capacity of global bias circuit 220 and the capacitances of global line 225, capacitor 244, the selected row line, and other connected circuitry.

After the charging period, the write operation in write pipeline 210 includes program cycles and verify cycles. During a program cycle such as between times T3 and T4, the control gate voltage, the drain voltage, and the source voltage of the selected memory cell are at levels that cause channel hot electron injection that raises the threshold voltage of the selected memory cell. In particular, the source line coupled to the selected memory cell is grounded. A column bias circuit 230 raises the selected column line to a voltage Vcp, which is typically between about 4.5 volts and about 5.5 volts. Local control circuit 250 raises signal VRL1 to a programming voltage Vpp1 by raising signal PGM1 to voltage Vpgm.

During a verify cycle, for example, such as between times T4 and T5, a sense amplifier 235 senses the conductivity of the selected memory cell while the control gate signal VRL1 of the selected memory cell is at voltage Vvfy1. Local control circuit 250 lowers the control gate voltage VRL1 back to Vvfy1 by grounding signal PGM1. If the selected memory cell stops conducting sufficient current, sense amplifier 2325 trips indicating the threshold voltage of the selected memory cell has risen to the level voltage Vvfy1 indicates. The write operation is then complete. For an accurate write operation, global bias circuit 220 during the charging period must generate signal Vvfy at a voltage that corresponds to the trip point of the sense amplifier 235 when the selected memory cell has a threshold voltage in the interval corresponding to the data value being written.

Another aspect of memory 200 is that global control circuit 240 can start a write operation in another write pipeline 210 while the first write pipeline 210 executes a write operation. In FIG. 3A, control circuit 240 starts the second write pipeline 210 on a write operation at time T4. In particular, data signal Din represents a second data value at time T4, and global bias circuit 220 generates signal Vvfy at a voltage Vvfy2 that corresponds to the second data value. At time T4, global control circuit 240 activates the local control circuit 250 for the second write pipeline 210, and during the interval between times T4 and T5, local control circuit 250 asserts signal PCH2 low to turn on transistor 242 in the second write pipeline 210. Global bias circuit 220 charges global line 225 and the selected local row line in the second write pipeline 210 to voltage Vvfy2. The write operation in second write pipeline is same as the write operation in the first write pipeline. Signal PGM2 rises to voltage Vpgm and raises row line signal VRL2 to voltage Vpp2 during program cycles. Signal PGM2 is grounded during verify cycles so that signal VRL2 is at voltage Vvfy2. Column bias circuit 230 controls the column line voltage to cause channel hot electron injection during program cycles, and sense amplifier 235 senses whether the selected memory cell has the threshold voltage corresponding to voltage Vvf2.

In memory 200, write pipelines 210 have independent signals PGM1 to PGMN, and each of signals PGM1 to PGMN stops pulsing at the end of a write operation in the associate write pipeline 210. Additionally or alternatively, column bias circuit 230 can change the column line and/or source line voltages to stop channel hot electron injection even when the associated one of signals PGM1 to PGMN is high. In yet another alternative embodiment, all pipelines 210 use the same signal PGM which continues to pulse, and column bias circuits 230 stop channel hot electron injection when a memory cell in the associated array reaches the target threshold voltage.

Equation 1 indicates how a programming voltage Vpp depends on the charge on the selected row line, the voltage Vpgm of signal PGM, and capacitive coupling ratio C of signal PGM to the selected row line.

$$Vpp = Vvfy + Vpgm * C \quad \text{Equation 1}$$

For a typical Flash memory cell, voltage Vpp needs to be in a range between about 7 volts and about 10 volts to achieve a typical threshold voltage window of about 3 volts. According to Equation 1, the programming voltage Vpp depends linearly on the voltage of signal Vvfy in the write pipeline. When the target threshold voltage for a memory cell is high, signals Vvfy and Vpp have correspondingly high voltages, and the programming voltage Vpp causes a relatively large change in threshold voltage during each program cycle. When the target threshold voltage for a memory cell is low, signals Vvfy and Vpp have correspondingly low voltages, and the programming voltage Vpp causes a relatively small change in threshold voltage during each program cycle. Accordingly, about the same number of program cycles are required to reach the target threshold voltage regardless of whether the target threshold voltage is high or low, and the resolution for writing threshold voltages is uniform across the range of target threshold voltages.

FIGS. 3B and 3C show more detailed plots of signals during program cycles 360 and 370 and verify cycles 365 and 375 in the exemplary embodiment of the invention. In FIGS. 3B and 3C, plots 310, 320, 330, 340, and 350 respectively represents the signal VRL on the selected row line, the signal on the selected column line, the voltage of the floating gate in the selected memory cell, an output signal SAOUT from a sense amplifier coupled to the selected column line, and an equalization signal EQ to prepare the selected column line for sensing. At the start of program cycle 360, the capacitive coupling of signal PGM to selected row line raises signal VRL on the selected row line from the verify voltage Vvfy (about 6V in this example) to the programming voltage Vpp (about 7.2 volts in this example). At about the same time that signal VRL rises to the programming voltage Vpp, column bias circuit 230 raises the voltage on the selected column line to a programming voltage Vcp of about 6 volts. (The source of the selected memory cell remains grounded.) The voltage on the floating gate of the selected memory cell rises in response to the programming voltages Vpp and Vcp, but injection current charges the floating gate to slowly lower the floating gate voltage and increase the threshold voltage of the selected memory cell during program cycle 360. In the example of FIG. 3B, the program cycle is about 100 ns. At the end of program cycle 360, column bias circuit 230 drops the voltage on the selected column line to a verify voltage Vcr which is less than about 1.5 to 2.0 volts in preparation for verify cycle 365.

In verify cycle 365, the selected memory cell conducts sufficient current to indicate that the selected memory cell's threshold voltage has not risen to the target threshold voltage level. For the verify cycle, the control gate voltage signal 310 is initially left high so that the memory cell conducts while column bias circuit 230 lowers the column line voltage to Vcr. The output signal SAOUT of sense amplifier 235 falls because the selected memory cell conducts sufficient current for sense amplifier 235 to sense while the control gate is at programming voltage Vpp. During this time, equalization signal 350 is asserted to prepare sense amplifier 235 for sensing. When local control circuit 250 lowers signal VRL 310 to Vvfy, the equalization signal is deasserted, and sense amplifier 235 senses for current through the selected memory cell. During verify cycle 365, the threshold voltage of the selected memory cell is below the target threshold voltage. Sense amplifier 235 senses that current through the selected memory cell is about equal or greater than the current from column bias circuit 230, and the output signal 340 from sense amplifier 235 remains low.

FIG. 3C shows a program cycle 370 during which the threshold voltage of the selected memory cell rises to the target threshold voltage. Program cycle 370 is otherwise the same as program cycle 360 described above. During the following verify cycle 375, sense amplifier 235 senses that the current through the selected memory cell is less than the maximum current from column bias circuit 230, and the output signal 340 rises (at time 8.58 μs) when sense amplifier 235 trips.

FIG. 4A illustrates a sense amplifier with circuitry for biasing the column line coupled to a selected memory cell. Such circuitry is suitable for use in memory 200 of FIG. 2. In FIG. 4, the bias circuitry includes a current mirror 410 having a reference current path through a reference column line of an associated array. Current mirror 410 also includes a normal current path and a high current path coupled to the selected column line through a local column decoder. A transistor 412 in the reference current path has its gate and drain coupled to the gates of transistors 414 and 416 in the normal and high current paths respectively. Signals NORMAL and HIGH selected which of the normal and high current paths supply the bias current to the selected column line for sensing. Transistor 416 has X times the channel width of transistor 414, and when the high current path is selected, mirror circuit 410 supplies a maximum bias current that is X times the maximum current that the normal current path supplies.

A pair of inverters 420 and 430 connect in series to a node 440 between current mirror 410 and the selected column line. For sensing, equalization signal EQ is asserted and a transistor 425 equalize the voltages on the input and output terminals of inverter 420 and puts inverter 420 in an unstable state to provide quicker sensing. When signal EQ is deasserted, the states of inverter 420 and inverter 430 change according to the voltage on node 440. A circuit 450 amplifies voltage swings that the selected column line causes on node 440 by drawing a current through the selected memory cell. At the trip point of the sense amplifier, the selected column line draws a current that is equal to the bias current from current mirror 410. Accordingly, the trip point of the sense amplifier changes according to the sizes of transistors 414 and 416, which are chosen during circuit design, and according to signals NORMAL and HIGH, which can be dynamically chosen during memory operation.

In FIG. 2, when the maximum current from column bias circuit 230 is very low during a verify cycle, the sense amplifier can sense a small current through the selected memory cell because even a small current through the selected memory cell pulls down the column line voltage. In this case, voltage Vvfy, which is the control gate voltage of the selected memory cell when sense amplifier 235 trips, is approximately equal to the target threshold voltage for the selected memory cell, and the range of signal Vvfy is about the same as the useable range of threshold voltages for memory cells, e.g., between about 3 volts and about 6 volts for typical flash memory cells. Since the suitable range for programming voltage Vpp on the control gate is typically between 7 and 10 volts and a maximum reasonably achievable capacitive coupling to the selected column line is about 70%, voltage Vpgm needs to be more than 5 volts to raise voltage Vpp into the desired range. Accordingly, a charge pump or other high voltage source is needed to raise a typical supply voltage Vcc of about 3 or 5 volts to the required voltage for Vpgm.

In accordance with another aspect of the invention, column bias circuit 230 provides a high bias current on the selected column line to raise the control gate voltage corresponding to the trip point of sense amplifier 235. FIG. 4B illustrates the effect of column line bias current on the control gate voltage corresponding to the trip point of a typical sense amplifier. For a plot 480 in FIG. 4B, a bias circuit supplies a maximum current of about 1 μA to the selected column line, and when a memory cell has a floating gate charged to between about −0.5 volts and −1 volt, a control gate voltage between 2 volts and 3 volts causes the memory cell to conduct a current sufficient to trip the sense amplifier. The control gate voltage must be above about 6 volts to trip the sense amplifier when the floating gate voltage is less than −3 volts and the column line bias current is about 1 μA If column line bias current is larger, the control gate voltage corresponding to the sense amplifier's trip point for a particular memory cell is higher because the memory cell must conduct a larger current in order to pull the column line voltage low enough to trip the sense amplifier. For plot 490, the bias current is 100 μA, and a control gate voltage of about 7 volts causes the memory cell to conduct a current sufficient to trip the sense amplifier when a memory cell has a floating gate charged to about −1 volt which provides a threshold voltage of about 2.5 volts. With the column line bias current at about 100 μA, the control gate voltage must be above about 10 volts to trip the sense amplifier when the floating gate voltage is less than −3 volts which provides a threshold voltage of about 6 volts. Accordingly, raising the column line bias current requires increasing the voltage of signal Vvfy for each data value. However, a higher voltage for signal Vvfy means that voltage Vpgm can be lower and still achieve a programming voltage Vpp in the required range. In one embodiment of memory 200 of FIG. 2, column bias circuit 230 selects the column line bias current for sense amplifier 235 during verify cycles so that voltage Vpgm is equal to the supply voltage Vcc. In this embodiment, local control circuits 250 do not require a charge pump to generate voltage Vpgm.

Signal Vvfy must be accurately set according to the bias current that the sense amplifier 235 uses during verify cycles. A read operation can use the same sense amplifier 235 and bias circuit 230. For example, one read operation sweeps a selected row line voltage across a voltage range. The voltage on the row line when sense amplifier trips indicates the stored value in the memory cell and can be converted to a multibit value. U.S. Pat. Nos. 5,748,533 and 5,748,534, both issued May 5, 1998, describe other suitable read methods using sense amplifiers to determine threshold voltages and are hereby incorporated by reference in their entirety. During a read, the high column line bias current used during verify operations results in high row line voltages when the sense amplifier trips. Alternatively, to lower the row line voltage, sense amplifier 235 can use a column line bias current during read operations that is lower than the bias current used during verify cycles.

In accordance with yet a further aspect of the invention, the column line bias current can be raised until the required voltages Vvfy for verify cycles are in the range suitable for program cycles. In this case, the control line voltage for the selected memory cell does not need to be raised for program cycles. As illustrated in FIG. 5, a memory 500 can thus eliminate the capacitive coupling to the selected row line and local control circuitry that generates signals PCM1 to PCMN. A simpler global control circuit 540 can control transistors 242 to turn on the appropriate transistors 242 during the charging periods for write pipelines 510.

FIG. 6 shows timing diagrams for signals in memory 500 during write operations in the first and second write pipelines 210. In FIG. 6, signal PCH1 turns on transistor 242 in the first write pipeline 210 during a charging period from T2 to T3, and global bias circuit 220 charges the selected row line to voltage Vvfy1 (which is equal to Vpp1) until the end of the write operation in the first write pipeline 210. During the write operation in the first write pipeline, row line voltage VRL1 remains nearly constant at a voltage Vvfy1, and column bias circuit 230 alternates the drain voltage between programming voltage Vcp for program cycles and voltage Vcr for verify cycles. Similarly, signal PCH2 turns on transistor 242 in the second write pipeline 210 during a charging period from T4 to T5, and row line voltage VRL2 remains nearly constant at voltage Vvfy2 (which is equal to Vpp2) during program and verify cycles in the second write pipeline 210.

As illustrated in FIG. 7, a global control circuit 740 in a memory 700 can generate the same signal PGM which all write pipelines 210 use to change the row line voltages for program cycles and verify cycles. An optional transistor (not shown) between capacitor 244 and control circuit 240 can stop pulsing of the row line voltage after the write operation reaches the target threshold voltage. Alternatively, column bias circuit 230 changes the biasing of the selected column line to prevent channel hot electron injection after the threshold voltage of the selected memory cell reaches the target threshold voltage.

Although the invention has been described with reference to particular embodiments, the description is only an example of the invention's application and should not be taken as a limitation. Various adaptations and combinations of features of the embodiments disclosed are within the scope of the invention as defined by the following claims.

I claim:

1. A method for programming a memory cell, comprising:
   connecting a bias circuit to charge a line that is coupled to a control gate of the memory cell;
   disconnecting the bias circuit from the line, wherein charge remains trapped on the line and controls a first programming voltage on the control gate of the memory cell; and
   applying a second programming voltage to a drain of the memory cell, wherein a combination of the first programming voltage on the control gate, the second programming voltage on the drain, and a voltage on a source of the memory cell changes a threshold voltage in the memory cell.

2. The method of claim 1, wherein the bias circuit charges the line to a first voltage, and the method further comprises capacitively coupling a second voltage to the line to raise the line from the first voltage to the first programming voltage.

3. The method of claim 2, wherein the first voltage is a voltage at which a sense amplifier coupled to the line sense a change in conductivity of the memory cell when the memory cell has a target threshold voltage, the method further comprising:
   (a) capacitively coupling the second voltage to raise the line from the first voltage to the first programming voltage for a program cycle during which the threshold voltage in the memory cell changes;
   (b) removing the second voltage from the capacitive coupling so that the line falls from the first programming voltage to the first voltage during a verify cycle;
   (c) sensing the conductivity of the memory cell during the verify cycle; and
   (d) repeating steps (a), (b) and (c) until sensing determines that the threshold voltage of the memory cell has reached the target threshold voltage.

4. The method of claim 3, further comprising selecting a maximum bias current for a column line coupled to a sense amplifier that performs the sensing, wherein the maximum bias current selected is such that second voltage, which is required to raise the line from the first voltage to the first programming voltage, is a supply voltage of an integrated circuit containing the memory cell.

5. The method of claim 1, wherein connecting the bias circuit to the line charges the line to the first programming voltage.

6. The method of claim 5, further comprising:
   (a) applying the second programming voltage to the drain during a program cycle during which the threshold voltage in the memory cell changes;
   (b) applying a second voltage to the drain during a verify cycle, wherein the control gate remains at a constant voltage through the program cycle and the verify cycle;
   (c) sensing the conductivity of the memory cell during the verify cycle; and
   (d) repeating steps (a), (b) and (c) until sensing determines that the threshold voltage of the memory cell has reached a target threshold voltage.

7. The method of claim 6, further comprising selecting a maximum bias current for a column line coupled to a sense amplifier that performs the sensing, wherein the maximum bias current selected is such that the first programming voltage corresponds to a trip point of the sense amplifier.

8. The method of claim 1, wherein the combination of the first programming voltage on the control gate, the second programming voltage on the drain, and the voltage on the source of the memory cell causes channel hot electron injection into a floating gate in the memory cell.

9. The method of claim 1, wherein the memory cell is in a first array from among a plurality of memory arrays in a non-volatile memory, and the line is a first row line coupled to control gates of a row of memory cells in the first array.

10. The method of claim 1, wherein connecting the bias circuit comprises:
    applying a data signal to the bias circuit, the data signal indicating a value to be written in the memory cell;
    generating from the bias circuit a first voltage that is selected according the value to be written; and
    charging the line to the first voltage.

11. The method of claim 10, wherein the value is a multibit digital value.

12. A method for programming a memory cell, comprising:
    connecting a bias circuit to charge a line that is coupled to a control gate of the memory cell, wherein the memory cell is in a first array from among a plurality of memory arrays in a non-volatile memory, and the line is a first row coupled to control gates of a row of memory cells in the first array;
    disconnecting the bias circuit from the line, wherein charge remains trapped on the line and controls a first programming voltage on the control gate of the memory cell; and
    applying a second programming voltage to a drain of the memory cell, wherein a combination of the first programming voltage on the control gate, the second programming voltage on the drain, and a voltage on a source of the memory cell changes a threshold voltage in the memory cell;
    connecting the bias circuit to charge a second row line in a second array from among the plurality of memory arrays, the second row line being coupled to a control gate of a second memory cell in the second array;

using the bias circuit to charge the second row line for programming operation to be performed on the second memory cell; and performing the programming operation on the second memory cell while also programming the memory cell in the first array.

13. The method of claim 12, wherein the programming operation on the second memory cell comprises:

disconnecting the bias circuit from the second row line, wherein charge remains trapped on the second row line and controls a third programming voltage on the control gate of the second memory cell; and applying the second programming voltage to a drain of the second memory cell, wherein a combination of the third programming voltage on the control gate of the second memory cell, the second programming voltage on the drain of the second memory cell, and a voltage on a source of the second memory cell changes a threshold voltage in the second memory cell.

14. The method of claim 13, further comprising:

applying a data signal to the bias circuit generating from the bias circuit a first voltage that is selected according a first value of the date signal, the first value being a data value to be written to the memory cell in the first array, wherein the bias circuit applies the first voltage to the first row line, the first voltage controlling the charge trapped on the first row line and thereby controlling the first programming voltage; and generating from the bias circuit a second voltage that is selected according a second value of the date signal, the second value being a date value to be written to the second memory cell, wherein the bias circuit applies the second voltage to the second row line, the second voltage controlling the charge trapped on the second row line and thereby controlling the third programming voltage.

15. The method of claim 14, wherein the first value and the second value are multibit digital values.

16. A non-volatile memory comprising:

a plurality of memory arrays, each memory array including memory cells arranged in rows and columns, row lines with each row line being coupled control gates of memory cells that are in a row of memory cells associated with the row line, and a row decoder coupled to the row lines;

a bias circuit having a input port for a date signal, the bias circuit generating a bias signal having a voltage that depends on a value of the date signal; and a control circuit coupled to the bias circuit and the plurality of memory arrays, the control circuit selecting which of the plurality of arrays receives the bias signal from the bias circuit, wherein:

during a first charging period of a write operation, the control circuit connects the bias circuit to the row decoder in a first array from among the plurality of arrays, and the bias circuit charges a selected row line in the first array for programming a first memory cell which is in the first array;

during a second charging period of the write operation, the control circuit connects the bias circuit to the row decoder in a second array from among the plurality of arrays, and the bias circuit charges a selected row line in the second array for programming a second memory cell which is in the second array; and the second charging period occurs during programming of the first memory cell.

17. The memory of claim 16, wherein the memory is a multi-bit-per-cell memory.

* * * * *